(12) United States Patent
Torresin et al.

(10) Patent No.: US 12,196,497 B2
(45) Date of Patent: Jan. 14, 2025

(54) HEAT DISSIPATION DEVICE

(71) Applicant: ABB Schweiz AG, Baden (CH)

(72) Inventors: Daniele Torresin, Baden (CH); Bruno Agostini, Zürich (CH); Andrey Petrov, Zürich (CH)

(73) Assignee: ABB Schweiz AG, Baden (CH)

( * ) Notice: Subject to any disclaimer, the term of this patent is extended or adjusted under 35 U.S.C. 154(b) by 367 days.

(21) Appl. No.: 17/557,485

(22) Filed: Dec. 21, 2021

(65) Prior Publication Data

US 2022/0196337 A1   Jun. 23, 2022

(30) Foreign Application Priority Data

Dec. 21, 2020   (EP) .................................... 20216178

(51) Int. Cl.
*F28D 15/04*   (2006.01)

(52) U.S. Cl.
CPC .................................. *F28D 15/04* (2013.01)

(58) Field of Classification Search
CPC .. F28D 15/04; F28D 15/0266; F28D 15/0233; H05K 7/20309; H05K 7/20409; F28F 1/12; F28F 7/00; F28F 7/02; F28F 13/003; F28F 2215/00; F28F 2225/06
See application file for complete search history.

(56) References Cited

U.S. PATENT DOCUMENTS

| | | | |
|---|---|---|---|
| 5,737,923 A * | 4/1998 | Gilley | H10N 10/13 165/104.33 |
| 9,440,216 B2 * | 9/2016 | Ryan | B01D 53/1425 |
| 2008/0149299 A1 * | 6/2008 | Slaughter | B22F 3/1115 430/269 |
| 2008/0149304 A1 * | 6/2008 | Slaughter | B22F 12/17 430/269 |
| 2017/0036170 A1 | 2/2017 | Ryan | |
| 2018/0187984 A1 * | 7/2018 | Manzo | F28F 13/12 |
| 2019/0069444 A1 | 4/2019 | Wan et al. | |

(Continued)

FOREIGN PATENT DOCUMENTS

| | | |
|---|---|---|
| CN | 207395544 U | 5/2018 |
| CN | 108369930 A | 8/2018 |

(Continued)

OTHER PUBLICATIONS

Extended European Search Report for corresponding European Application No. 20216178.2, dated May 17, 2021, 7 pps.

(Continued)

*Primary Examiner* — Tho V Duong
(74) *Attorney, Agent, or Firm* — McCarter & English, LLP

(57) ABSTRACT

A heat dissipation device is provided herein. The heat dissipation device includes an evaporator chamber at least partially filled with a working fluid to be evaporated when being heated by a heat source; at least one condenser chamber for receiving evaporated working fluid and for condensing the evaporated working fluid, wherein the condenser chamber is interconnected with the evaporator chamber in a fluid conductive manner; and at least one air fin element interconnected between the condenser chamber and one of a further condenser chamber and a side wall of the heat dissipation device; wherein the air fin element has a triply periodic surface providing air fins.

13 Claims, 9 Drawing Sheets

(56) References Cited

U.S. PATENT DOCUMENTS

2019/0274925 A1* 9/2019 Vlahinos .............. B65D 25/108
2019/0353430 A1 11/2019 Narasimhan et al.
2020/0215480 A1* 7/2020 Roy ..................... B01D 53/228

FOREIGN PATENT DOCUMENTS

EP 2735593 A1 5/2014
FR 2664033 A1 1/1992
TW M461980 U 9/2013

OTHER PUBLICATIONS

Gokul Chandrasekaran, "3D Printed Heat Exchangers an Experimental Study," Master of Science Degree, Arizona, 2018.
"Vapor Chambers Explained," NCT Advanced Cooling Technologies, URL: https://www.1-act.com/resources/heat-pipe-fundamentals/different-types-of-heat-pipes/vapor-chambers/, retrieved Dec. 15, 2021.
"Triply Periodic Minimal Surfaces," Susquehanna University, URL: http://facstaff.susqu.edu/brakke/evolver/examples/periodic/periodic.html, retrieved Dec. 15, 2021.
H. A. Schwarz, Gesammelte Mathematische Abhandlungen, Springer, Berlin, 1933.
E. R. Neovius, "Bestimmung zweier spezieller periodischer Minimalflächen", Akad. Abhandlungen, Helsingfors, 1883.
Alan H. Schoen, Inifinite periodic minimal surfaces without self-intersections, Nasa Technical Note, NASA TN D-5541, 1970.

* cited by examiner

HEAT DISSIPATION DEVICE

CROSS-REFERENCE TO RELATED APPLICATIONS

The present application claims priority to European Patent Application No. 20216178.2, filed on Dec. 21, 2020, the disclosure of which is hereby incorporated by reference in its entirety.

FIELD OF THE DISCLOSURE

The disclosure relates to a heat dissipation device.

BACKGROUND

In electrical appliances, where semiconductor devices are installed, significant heat energy is generated during operation of the device which is unavoidable due to physical effects. To maintain a good operational temperature level of the devices, efficient cooling is required.

Vapor chamber technology is used to enhance the heat transfer to the cooling media, being it air or water, because of a more effective utilization of the heat transfer area compared to state-of-the-art heat sinks. Vapor chamber-based heat sinks can be used to retrofit state-of-the-art metallic heat sinks in some cases with minimal design effort and changes in the original geometry. This is done for instance by bonding 2D vapor chambers to standard air fins stack or by bonding metallic lamellas to the vapor chambers. A standard 2D vapor chamber includes an air fins stack, a vapor chamber evaporator and a vapor chamber lid.

Vapor chambers have the potential to reduce the thermal resistance with respect to a metal heat sink, provided that the heat source's area is smaller than the baseplate area, so that there is room for heat spreading.

There is a variety of applications where vapor chambers are involved like computer CPU or graphic cards cooling, blade servers, automotive, avionics, spacecraft, LED thermal management and medical applications. For these applications, the usual range of cooling requirements is up to a few hundred watts.

Increasing the thermal losses like in the case of power electronics cooling (in the kW range), with the same geometry of heat sink, may require advanced systems that go beyond the limit of a simple vapor chamber. Therefore, it is fundamental to improve the most penalizing thermal resistance which, in the case of air-cooled vapor chambers, is dominated by the air side.

The first option concerns the enhancement of the heat transfer at the condenser side by utilizing more efficient air fins. What is already available on the market are straight/lamellas air fins. The thermal performance of these structures is quite limited and the increase of heat transfer area considering the available volume is not optimized. Louvered fins are a quite well established and known technology but not readily available for vapor chamber heat sinks yet.

The second option concerns the enhancement of the heat transfer at the condenser by connecting heat pipes or other vapor chambers normally mounted and included in the fins pack. These solutions are sometimes addressed as 2.5-D vapor chambers and 3D vapor chambers, respectively. With these designs, the internal fluid volume is increased by higher heat load dissipation capabilities and the fins efficiency is increased. Nevertheless, the heat transfer coefficient limitation of the elements used as air fins remains.

With 3D vapor chambers it is also required to use some mechanical elements to bond both surfaces of the condenser, e.g. pillars, in order to withstand the internal fluid pressure during operation. The use of these elements adds manufacturing costs and constrains the free space for the vapor flow.

U.S. Pat. No. 9,440,216 B2 discloses a minimal surface area mass and heat transfer packing. In order to improve mass and/or heat transfer, triply periodic minimal surfaces are provided. The device is designed for circulating fluids and cannot withstand high internal pressure.

FR 2 664 033 A1 (D1) describes an air-cooled evaporator and condenser apparatus including a cold plate having a finned arrangement which, in conjunction with the cold plate, forms part of an isolated evaporation chamber of a cooling unit. The chamber houses a boilable fluid which may change its phase from liquid to vapor. Positioned above and contiguous with the isolated chamber is a condensing chamber, including a plurality of tubular passageways, the external portions of which are finned for ready removal of heat. Heat may be transferred through the cold plate to cause boiling of the fluid within the chamber, the vapor of which is condensed in the upper part of the cooling unit to thus return as fluid to the chamber.

US 2019/069444 A1 (D2) describes a phase change evaporator including an evaporator body, a conducting bottom plate, and multiple heat-dissipating fins. The evaporator body is mounted on a top surface of the conducting bottom plate. The multiple heat dissipating fins are conductively connected with the top surface of the conducting bottom plate not occupied by the evaporator body and a top of the evaporator body. The evaporator body has a space, a coolant exit and a coolant inlet. The space is defined inside the evaporator body. The coolant exit is formed through a top wall of the evaporator body and communicates with the space inside the evaporator body. The coolant inlet is formed through a sidewall of the evaporator body and communicates with the space inside the evaporator body.

US 2008/149299 A1 (D3) describes a heat exchanger component including a minimal surface. The minimal surface may be triply periodic.

US 2018/187984 A1 (D4) describes a heat exchanger assembly including a bypass core enclosed within a housing, a centrifuge disposed proximate an input to the core, and a remixer proximate a core output. The core exhibits smaller diameter cells near the linear axis of the core, and larger diameter cells near the perimeter of the core cross-section. Varying the unit cell diameter and, hence, the channel cross section may be achieved by manipulating the lattice parameter which characterizes the unit cell.

BRIEF DESCRIPTION OF THE CLAIMS

The embodiments described herein create a heat dissipation device with improved heat transfer capabilities and/or improved mechanical robustness.

This is achieved by the subject-matter of the independent claims. Further exemplary embodiments are evident from the dependent claims and the following description.

The disclosure relates to a heat dissipation device and/or a vapor chamber, which may be used for cooling semiconductor devices. The heat dissipation device has a novel design of air fins in an air fin element using triply periodic surfaces, in particular minimum surfaces. The air fin element may maximize a heat transfer rate for a cooling air flow circulating through the heat dissipation device, and minimizing an air pressure drop. The air fin element furthermore may increase a mechanical stiffness of the arrangement of condenser chambers in the heat dissipation device.

According to an embodiment of the disclosure, the heat dissipation device includes an evaporator chamber at least partially filled with a working fluid to be evaporated when being heated by a heat source, such as a semiconductor device, and at least one condenser chamber for receiving evaporated working fluid and for condensing the evaporated working fluid, wherein the condenser chamber is interconnected with the evaporator chamber in a fluid conductive manner. It may be that the heat dissipation device includes a plurality of the condenser chambers. The one or more condenser chambers may be aligned orthogonally to the evaporator chamber. The evaporator chamber and/or the one or more condenser chambers may have a substantially cuboid body. The evaporator chamber and/or the one or more condenser chambers may have an internal cavity, in which the working fluid circulates. The internal cavities may be connected with each other for allowing fluid exchange.

According to an embodiment of the disclosure, the heat dissipation device further includes at least one air fin element interconnected between the condenser chamber and one of a further condenser chamber and a side wall of the heat dissipation device. The air fin element may have a triply periodic surface providing air fins.

An air fin element may be provided between two neighboring condenser chambers and/or between a condenser chamber and a neighboring side wall of the heat dissipation device. The heat dissipation device may include more than one air fin element. In general, the air fin element may be provided between two walls of the heat dissipation device, such as a wall of a condenser chamber and a side wall or two condenser chamber walls. The air fin element may extend in a cuboid space between two such walls.

The air fin element is composed of a triply periodic surface. Tripe periodic may mean that the surface is composed of equally shaped elementary cells. The elementary cell may repeat in every spatial direction. It has to be understood that the air fins provided by the triply periodic surface will have a thickness, which, however, will be substantially thinner that voids between the air fins. In other words, for the air fin element, the triply periodic surface is provided with a thickness, when being manufactured.

According to an embodiment of the disclosure, more than one type of a triply periodic surface may be attached to one or more condenser chambers. It may be that different types of triply periodic surfaces are used for different air fin elements.

According to an embodiment of the disclosure, the triply periodic surface is a minimal surface. A minimal surface is a surface extending between curves having minimal area. Such a minimal surface has advantages in view of heat transfer, when used as air fins.

According to an embodiment of the disclosure, the triply periodic surface is a Schwarz primitive (P) triply periodic surface, a Schwarz diamond (D) triply periodic surface and/or a gyroid triply periodic surface. However, the triply periodic surface may be any surface that is invariant under a rank-3 lattice of translations optionally combined with a scaling.

The Schwarz minimal surfaces are periodic minimal surfaces originally described by Hermann Schwarz. There are different types of Schwarz structure depending on the configuration surface, for example Schwarz P (Primitive), Schwarz D (Diamond) or Schwarz F (Surface), Schwarz H (Hexagonal) and Schwarz CLP (crossed layers of parallels). The Schwarz surfaces are one example in the family of periodic minimal surfaces. Schwarz minimal surfaces may result in the best ratio of heat transfer over pressure drop, which may be advantageous for heat transfer applications. Compared to standard straight or wavy lamellas, these surfaces may have an increased air heat transfer coefficient because of the higher turbulence and continuous breaking of boundary layer, an increased heat transfer area for a given heat sink volume, and a simpler design of the condenser elements for 3D vapor chambers thanks to their higher mechanical stiffness compared to lamellas as air fins.

According to an embodiment of the disclosure, the triply periodic surface is composed of equally shaped elementary cells. Equally shaped may mean that the surface within one elementary cell is equal to the surface with another elementary cell, when the elementary cell is overlaid with the other elementary cell. This may be done by translation and optionally scaling and/or sharing.

According to an embodiment of the disclosure, the triply periodic surface has a scaling gradient along at least one given axis along which a size of the elementary cell varies. The term "scaling gradient" may mean that the triply periodic surface is locally rescaled, such that an elementary cell at one position has a different size as an elementary cell at another position. For a scaling gradient along a given axis, the size of elementary cells along the given axis may vary, i.e. may increase or may decrease.

According to an embodiment of the disclosure, a scaling of elementary cells is reduced along an air flow direction, wherein a maximum scaling is provided at an air inlet side and a minimum scaling at an air outlet side. For example, the period size may be 5 mm at an air inlet side, and gradually or stepwise be reduced to 2 mm to an air outlet side, or have any other possible scaling variation. The purpose of such a variation may be to maximize the heat transfer while reducing the pressure drop.

According to an embodiment of the disclosure, a scaling of elementary cells is reduced or increased along a direction between the condenser chamber and the further condenser chamber. A scaling of elementary cells also may be reduced or increased along a direction between the condenser chamber and the side wall of the heat dissipation device. Such a scaling may result in an inhomogeneous heat transfer, which may be beneficial, when the condenser chambers and/or walls besides the air fin element needed differently strong cooling.

According to an embodiment of the disclosure, the triply periodic surface of the air fin element and a condenser chamber wall of the condenser chamber are aligned with each other. This may mean that side faces of elementary cells of the triply periodic surface lie in a plane defined by the condenser chamber wall. The triply periodic surface also may be aligned with a wall of the further condenser chamber and/or with the side wall of the heat dissipation device.

According to an embodiment of the disclosure, the triply periodic surface of the air fin element and at least one of the condenser chamber wall and the side wall are aligned such that their intersection area is maximized. Such an increased intersection area may maximize the condenser robustness and increases the fin efficiency, which leads, respectively, to higher admissible working pressure and reduced air side thermal resistance.

According to an embodiment of the disclosure, the air fin element has at least one reinforced rib being a part of the air fin element having a greater wall thickness than another part of the air fin element. A reinforcement rib may be a thickened and/or reinforced air fin. In its elementary cell, the part of the triply periodic surface, which provides the reinforcement rib, is thicker than an equivalent part in other elementary cells. A reinforcement rib may be used for mechanical stiffen the air fin element.

According to an embodiment of the disclosure, the reinforced rib is extending between the condenser chamber and one of the further condenser chambers and the side wall of the heat dissipation device. The reinforced rib may be orthogonal to the walls of the condenser chambers and/or the side wall. Such a reinforced rib may be used for mechanically stiffing the condenser chambers.

According to an embodiment of the disclosure, at least one reinforced rib is provided at an air inlet side and/or at an air outlet side and/or at a top of the air fin element. Reinforcement ribs may be placed, such that a maximal stiffness of the arrangement of condenser chambers and air fin elements is achieved.

According to an embodiment of the disclosure, at least one reinforced rib is provided at a location within the air fin element having a local maximum of von Mises stress simulated with given vapor pressure inside the condenser chamber. In the areas of an increased mechanical stress load, especially in the areas of a maximum of simulated von Mises stress, a wall thickness of the triply periodic surface may be locally increased to be able to withstand the elevated mechanical load in the area. Such areas usually are present at air inlet and/or outlet side and/or at the upper end/top of the condenser chambers. The maxima of simulated von Mises stress can be found, by simulating the heat dissipation device and calculating the areas, where the von Mises stress is maximal.

According to an embodiment of the disclosure, the heat dissipation device is made by additive manufacturing. For example, the heat dissipation device and in particular the air fin element may be made from aluminum.

These and other aspects of the disclosure will be apparent from and elucidated with reference to the embodiments described hereinafter.

BRIEF DESCRIPTION OF THE DRAWINGS

The subject-matter of the disclosure will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF THE DISCLOSURE

Figure 1:
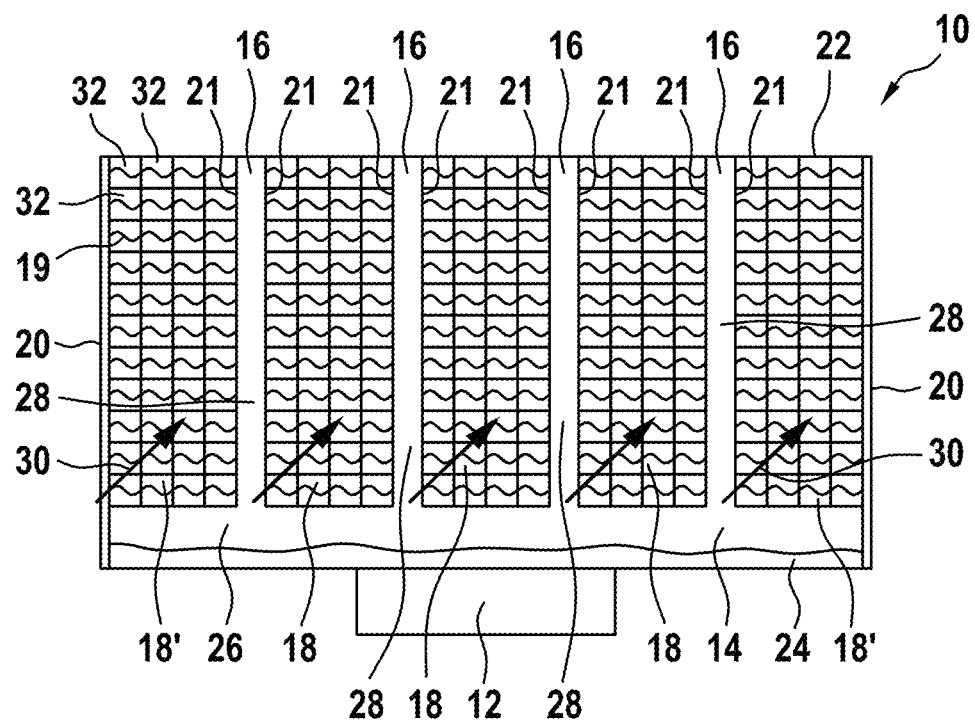
FIG. 1 schematically shows a cross sectional view of a heat dissipating device according to an embodiment of the disclosure.

FIG. 1 shows a cross sectional view of a heat dissipating device 10, which is attached to a heat source 12, such as a semiconductor device. The heat dissipating device 10 includes an evaporator chamber 14, a number of condenser chambers 16 and air fin elements 18 between each pair of adjacent condenser chambers 16. Each air fin element 18 provides air fins 19 for cooling the condenser chambers 16.

On both the outer left and the outer right side of the arrangement of condenser chambers 16 there is an additional air fin element 18', which interconnects the left-most respectively the right-most condenser chamber 16 and a side wall 20. The evaporator chamber 14 may have a cuboid shape. Each of the condenser chambers 16 may have two parallel walls 21 being spaced apart from each other thus enabling the flow of a fluid inside.

On the bottom side, the condenser chambers 16 are connected to the evaporator chamber 14. On the top side, the condenser chambers may be connected to a terminal plate 22.

The evaporator chamber 14 is provided at the bottom and the condenser chambers 16 on top of the heat dissipating device 10. The condenser chambers 16 and the optional side walls 20 are arranged orthogonal to an upper wall of the evaporator chamber 14 and/or may extend vertically.

Both the condenser chambers 16 and the evaporator chamber 14 may have metallic, heat conductive walls and may be attached to each other such that a conductive heat transfer is enabled between said parts and that the heat of a working fluid 24 trapped inside the heat dissipating device 10 can be transferred from the inside to the outside of the condenser chambers 16 and the evaporator chamber 14, in particular through the condenser chamber walls 21.

An evaporator cavity 26 of the evaporator chamber 14 is at least partially filled with the working fluid 24 to be evaporated when being heated by the heat source 12, which is attached to the evaporator chamber 14 in a heat conductive manner. The working fluid 24, when evaporated in the evaporator cavity 26, rises into condenser cavities 28 provided inside the condenser chambers 16, which then receive the evaporated working fluid 24. By enabling heat transfer from the working fluid 24 through the walls 21 of the condenser chambers 16, the evaporated working fluid 24 condenses and runs along these condenser chamber walls 21 back to the chamber cavity 26 as a liquid. A wick inside the evaporator chamber 14 and/or the condenser chambers 16 may facilitate the return of the working fluid 24. The wick can be made of a fibrous wicking material. The wick may facilitate the movement of the working fluid 24 by capillary forces. The capillary forces may overcome gravity to a certain extent. The capillary forces may be caused by the working fluid 24 being attracted to pores in the wick.

The heat generated at the heat sink formed of air fin elements 18, 18', which are attached to the condenser chamber walls 21 and the side walls 20 is transferred to an outside by an air flow 30, which flows orthogonally to the drawing layer of FIG. 1. The air flow 30 is separated into partial air streams each of which runs through an air fin element 18, 18'. The terminal plate 22 may effect a termination on the top side for the air flow 30 extending through the air fin elements 18, 18'.

An air fin element 18, 18' does not only enable the heat transfer from the working fluid 24 through the condenser chamber wall 21 to the outside where heat can be removed by an air flow 30, but also serves as a stiffening element between each pair of condenser chambers 16 and optionally between a condenser chamber 16 and a side wall 20. As the fluid conductive system (i.e. the evaporator chamber cavity 26 and the condenser chamber cavities 28) of the heat dissipating device 10 is a closed system, the evaporation process of the working fluid 24 may result in high internal pressure. By providing an air fin element 18, 18' which is able to absorb high mechanical forces, the whole alternating arrangement of air fin elements 18, 18' and condenser chambers 16 is stiffened. Furthermore, by providing an additional air fin element 18' on both outer sides, the entire arrangement of condenser chambers 16 and air fin elements 18 between them is supported by the outer side walls 20.

The air fin elements 18, 18' are composed of equally shaped elementary cells 32 as indicated in FIG. 1. These elementary cells 32 may be periodically arranged in all three spatial dimensions between the walls 20, 21, i.e. may be triply periodic. The same applies to a surface of the air fin elements 18, 18', which also maybe triply periodic.

Figure 2:
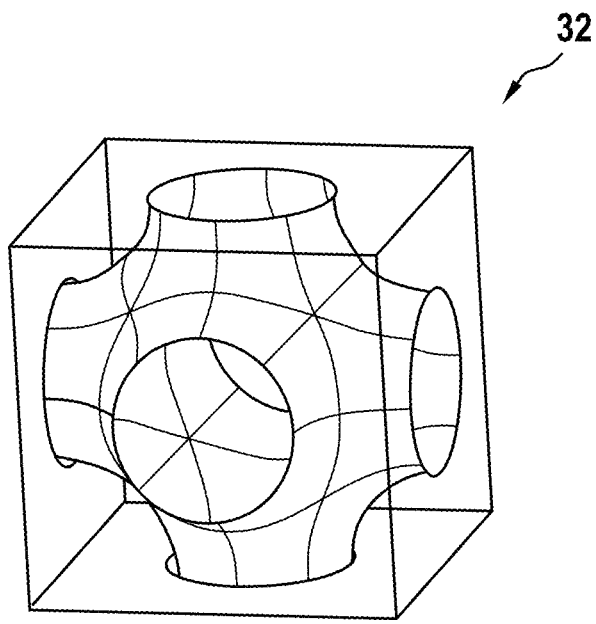
FIG. 2 shows a perspective view of a single elementary cell of "Schwarz P"-type.

FIG. 2 is a perspective view of a single elementary cell 32, which may be a base element of the air fins 19 in the air fin element 18, 18'. The elementary cell 32 has a "Schwarz P" (Schwarz primitive) minimal surface. The "Schwarz P"-type surface has a high surface-to-volume ratio and a high resulting porosity thereby. The benefit of such surface is that an air flow resistance is reduced by high porosity and that at the same time, the increased surface area fosters heat transfer from the air fins 19 to the air flow 30. Besides, it withstands high mechanical forces exerted on either side as the round shape avoids local stress peaks. Because of their complex geometry, they usually need to be manufactured by additive manufacturing. The extension of the single elementary cell 32 may be equal in all three dimensions, which is demonstrated by the engirding cube frame in FIG. 2.

Figure 3:
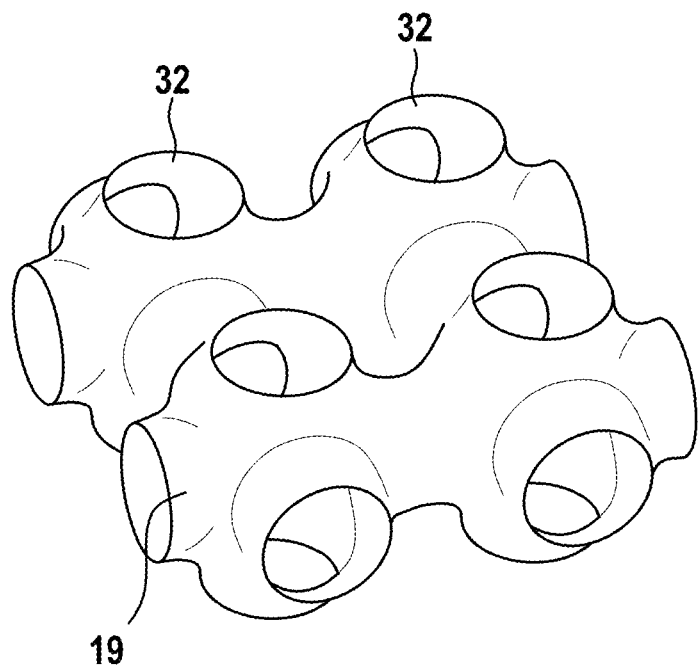
FIG. 3 shows a surface made of four elementary cells according to FIG. 2.

Thus, to build a larger surface which is illustrated in FIG. 3, which may be part of the surface of an air fin element 18, 18', a number of cells 32 can be added one by one.

Figure 4:
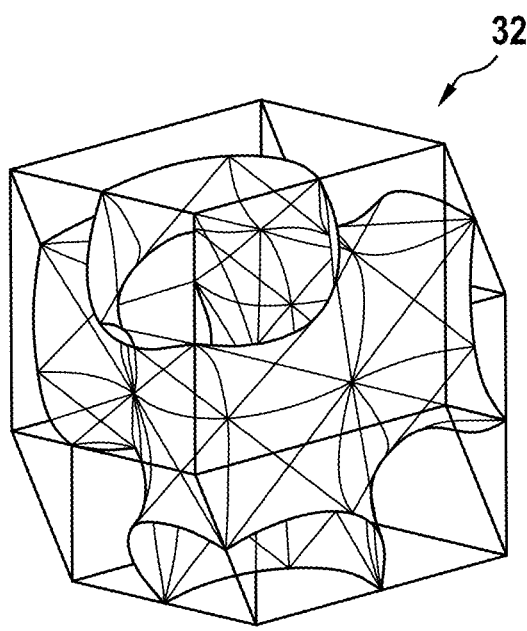
FIG. 4 shows a perspective view of a single elementary cell of "Schwarz D"-type.

FIG. 4 is a perspective view of another single elementary cell 32 which has a "Schwarz D" (Schwarz diamond) minimal surface.

Figure 5:
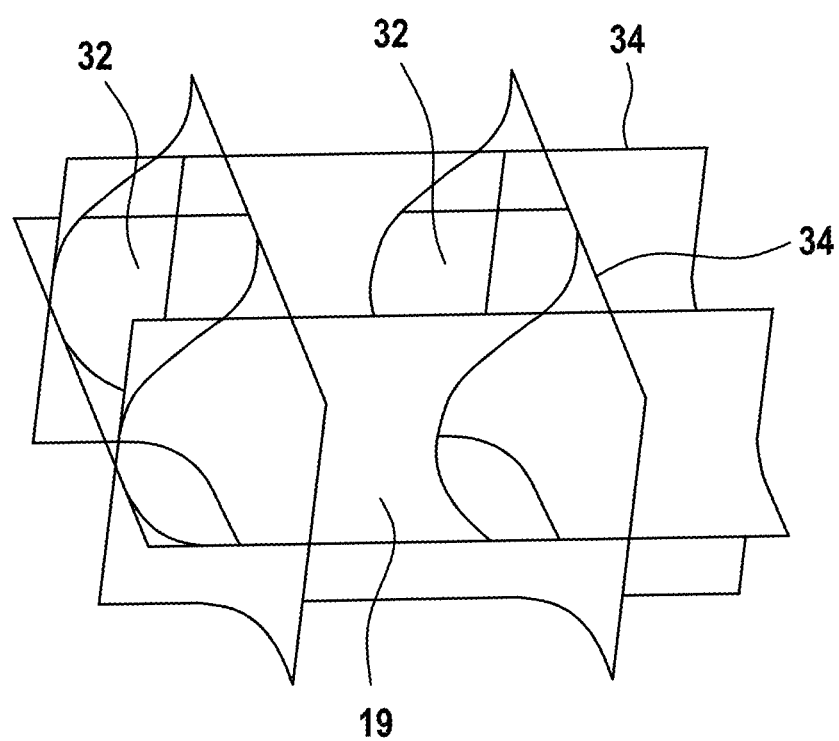
FIG. 5 shows a surface made of four elementary cells according to FIG. 4.

A surface made of such four elementary cells 32 is illustrated in FIG. 5. The advantage of this cell type may be that by a combination of a series of Schwarz D elementary cells 32, a grid structure of linear webs 34 in orthogonal arrangement is created. The linear webs 34 are embedded in and reinforced by a spherical, rounded structure.

Figure 6:
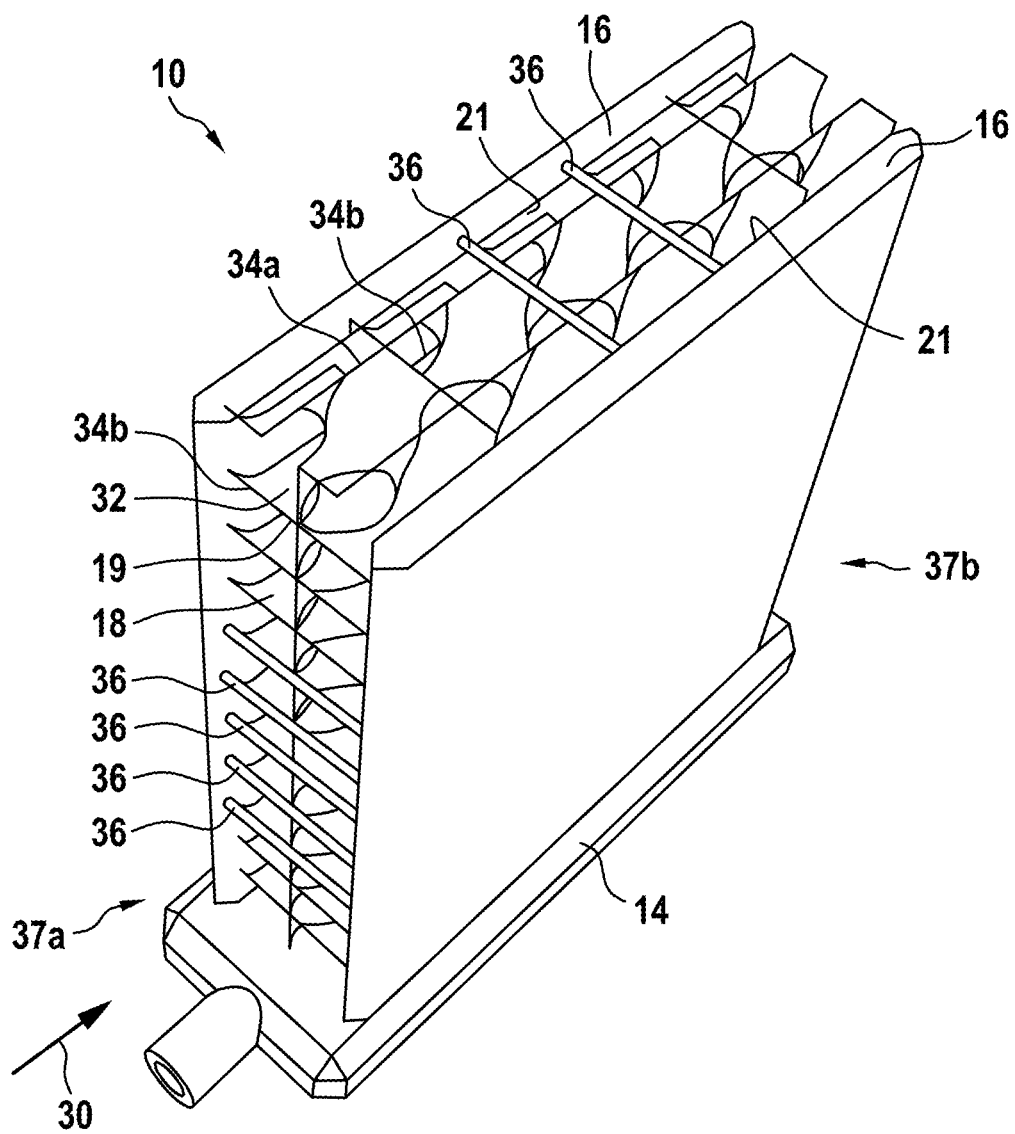
FIG. 6 shows a perspective view of a heat dissipation device according to an embodiment of the disclosure.

FIG. 6 is a perspective view of a heat dissipation device 10. There are two adjacent condenser chambers 16 on top of the evaporator chamber 14. The condenser chambers 16 are linked to each other by an air fin element 18, which is composed of elementary cells 32. The air fin element 18 is a triply periodic minimal surface of the "Schwarz D"-type as illustrated in FIG. 4 and FIG. 5. The air flow 30 is indicated by an arrow.

Unlike with sheet-like or wavy air fins 19, the air fins 19 of the air fin element 18 are not separable from each other, i.e. apart from the outside edges of the whole unit, no specific beginning or end of an air fin can be determined within the structure. However, a first set of webs 34a can be identified within the 3D structure of the air fin element 18, which extend in parallel to the condenser chambers 16 and a second set of webs 34b, which extend orthogonal to the first set of webs 34a thereby interlinking the adjacent condenser chambers 16. To make a very robust mechanical unit, some of the webs 34b are thickened to produce reinforced ribs 36. At these ribs 36, the wall thickness may be increased, for example by 50% to 100% of a wall thickness in other regions of the air fin element 18, 18'. In general, the ribs 36 may be thickened parts of the air fin element 18, such as parts of one cell 32, which are thicker as equivalent parts of another cell 32.

As shown in FIG. 6, some of the reinforced ribs 36 may be at an air inlet side 37a, but also may be provided at an air outlet side 37b of the air fin element 18.

Figure 7:
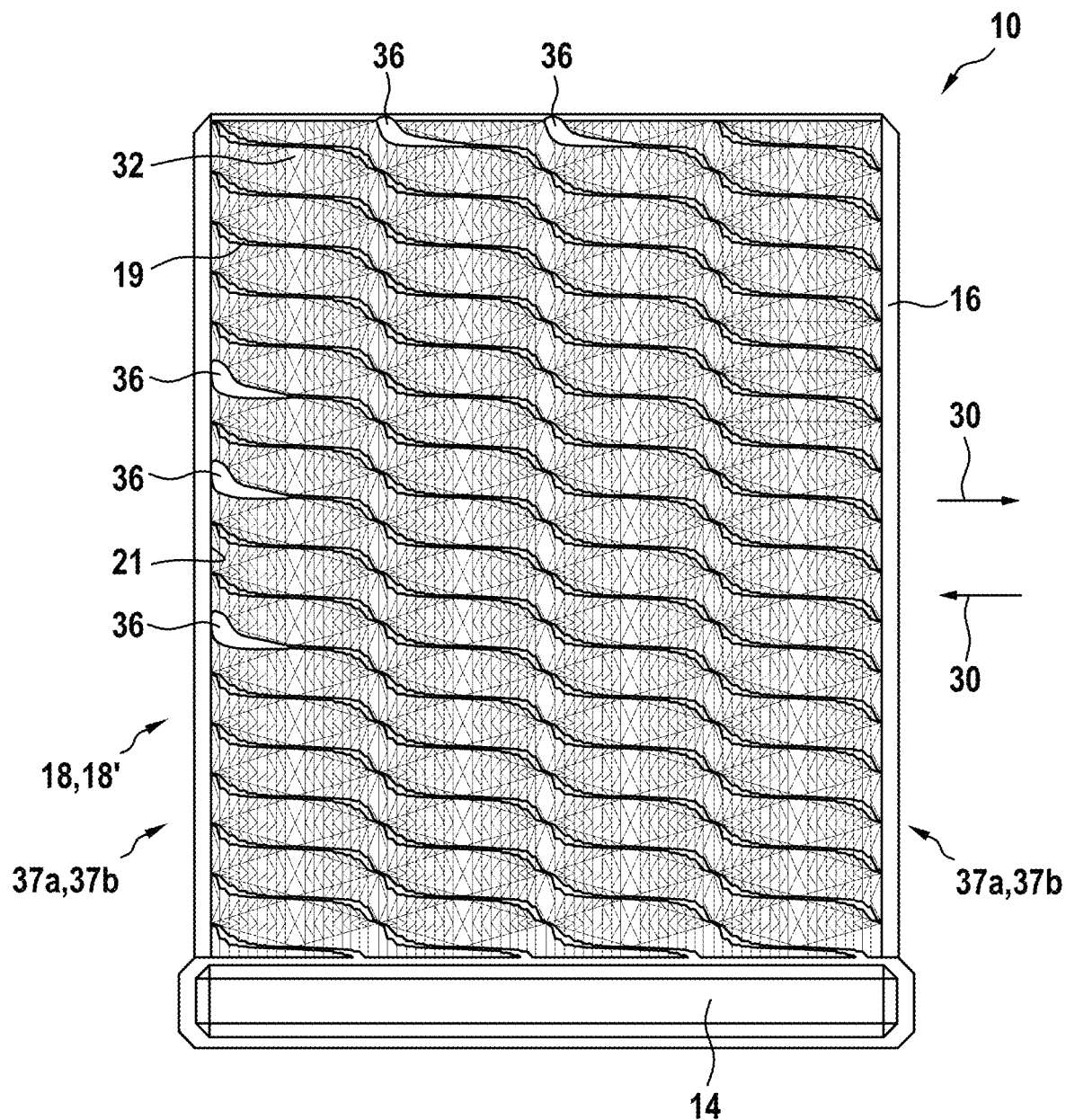
FIG. 7 shows a sectional plane view of a heat dissipation device according to an embodiment of the disclosure.

FIG. 7 is a sectional view of a heat dissipation device 10, such as the one of FIG. 6. The section plane is in parallel to the air flow direction of FIG. 6 and arranged near a condenser chamber 16 and its wall 21. The air flow 30 may be from left to right or from right to left. On an air inlet side or an air outlet side, depending on the air flow 30, reinforced ribs 36 are provided, which serve as stiffening elements. Such reinforced ribs 36 also may be provided on both sides. Alternatively or additionally, such reinforced ribs 36 may be provided on a top side and/or in a center of the air fin element 18, 18'. This may avoid the structure of the air fin element 18, 18' and the condenser chamber 16 from collapsing even if internal pressure is very high in any of the adjoining condenser chambers 16.

In FIG. 7, a wavy contour of the fins 19 can be seen. However, the contour varies with the position of the section plane as the fins 19 are made of complex elementary cells 32, such as illustrated in FIGS. 2 to 5. Consequently, there is a strong reinforcing effect to the condenser chamber walls 21 when the intersection of the fins 19 of the air fin element 18, 18' and the condenser chamber walls 21 is optimized.

Figure 8:
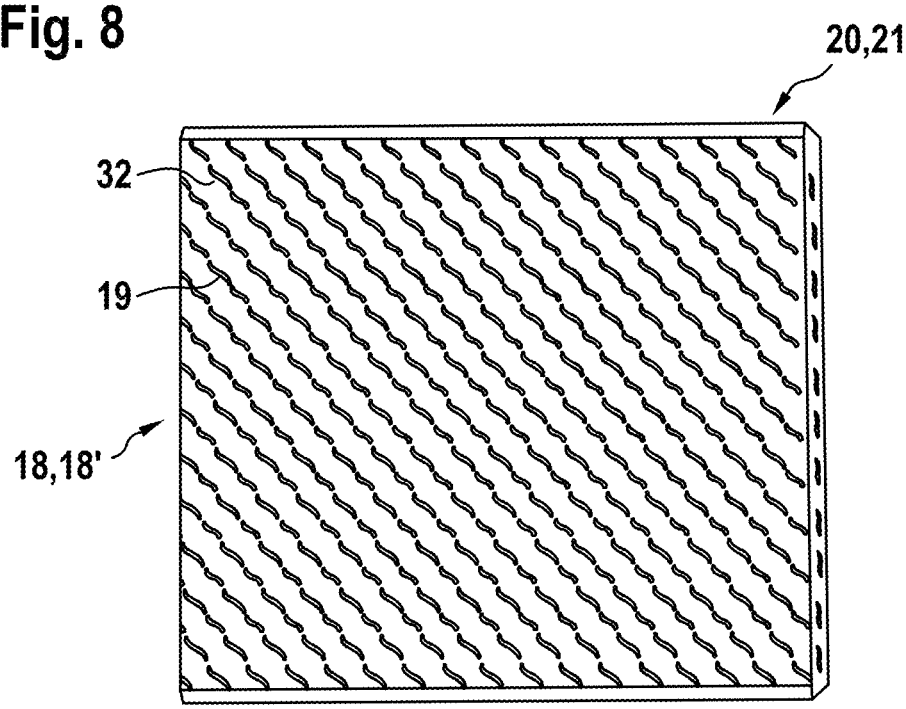
FIG. 8 shows an intersection area of an air fin element and a condenser chamber wall according to a first alignment.
Figure 9:
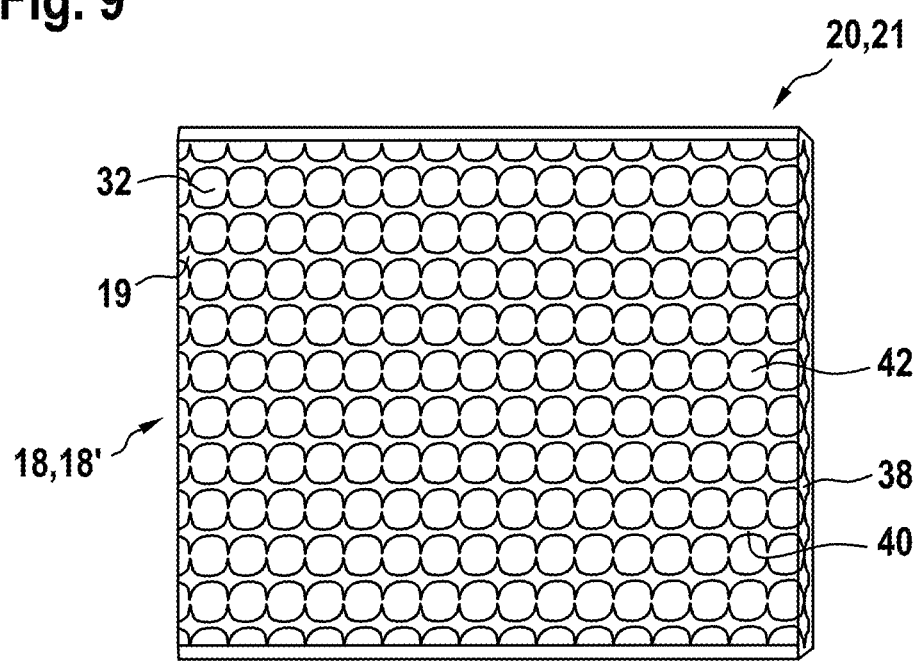
FIG. 9 shows an intersection area of an air fin element and a condenser chamber wall according to a second alignment.

FIGS. 8 and 9 each show a section through a part of a heat dissipation device 10 in a plane, where an air fin element 18, 18' is attached to a wall 21 of a condenser chamber 16 or to a side wall 20. FIGS. 8 and 9 show an intersection resulting from two different alignments of the triply periodic surface of the Schwarz D type and the wall 20, 21.

In FIG. 8, the intersection area of the air fin element 18, 18' and the wall 20, 21 is minimized, which may result in a lower robustness of the condenser chamber 16 and lower heat transfer from the wall 20, 21, which however may be beneficial in some situations.

In FIG. 9, the intersection area of the air fin element 18, 18' and the wall 20, 21 is maximized. The intersection area may be described as a plurality of nodal points 38 arranged in multiple rows and columns. There is a smooth transition from each thick nodal point 38 to a thin rod 40 by which the nodal points 38 are interlinked. This results in voids 42 each of which is arranged between four nodal points 38 and four rods 40. Such a void may have a nearly circular shape and/or a square shape with smoothly rounded corners. By this structure of the intersection area, the chamber robustness and the heat transfer from the condenser wall are increased.

Figure 10:
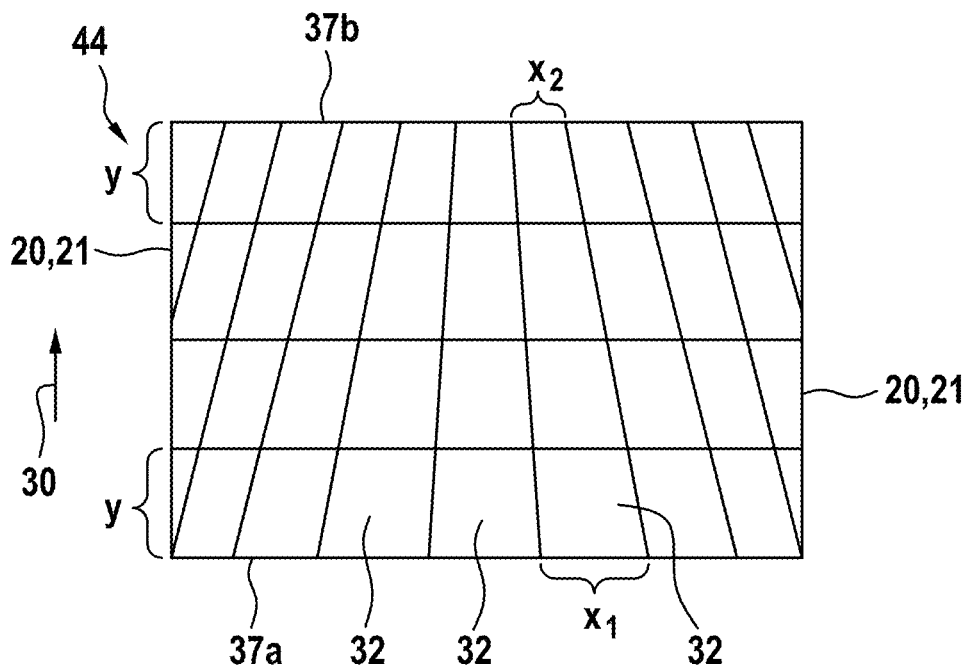
FIG. 10 shows a schematic first grid with variant width of elementary cells.
Figure 11:
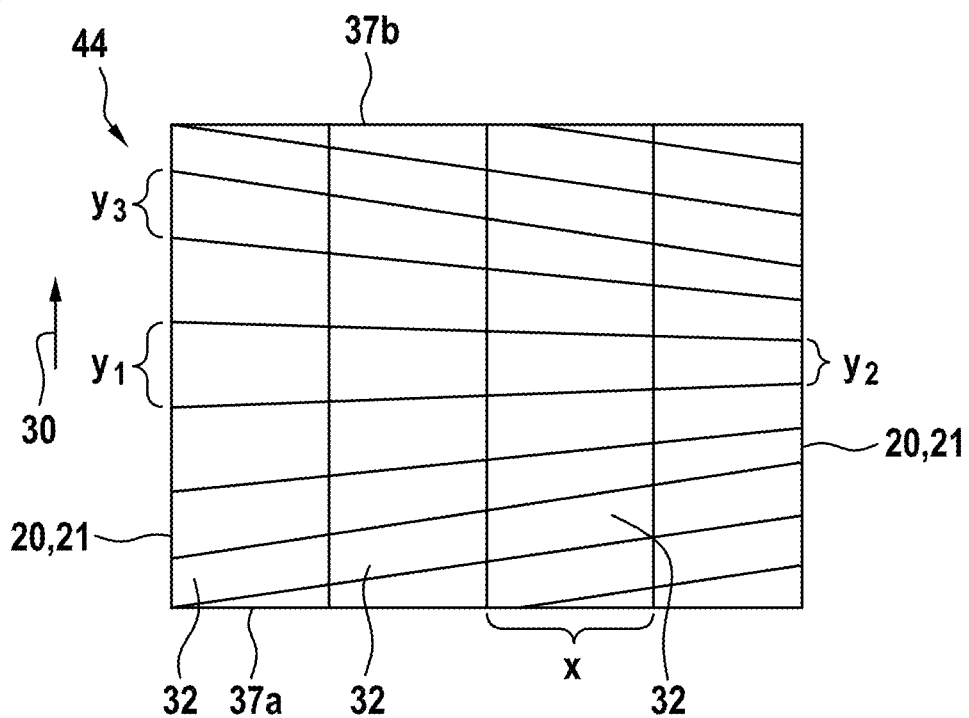
FIG. 11 shows a schematic second grid with variant depth of elementary cells.
Figure 12:
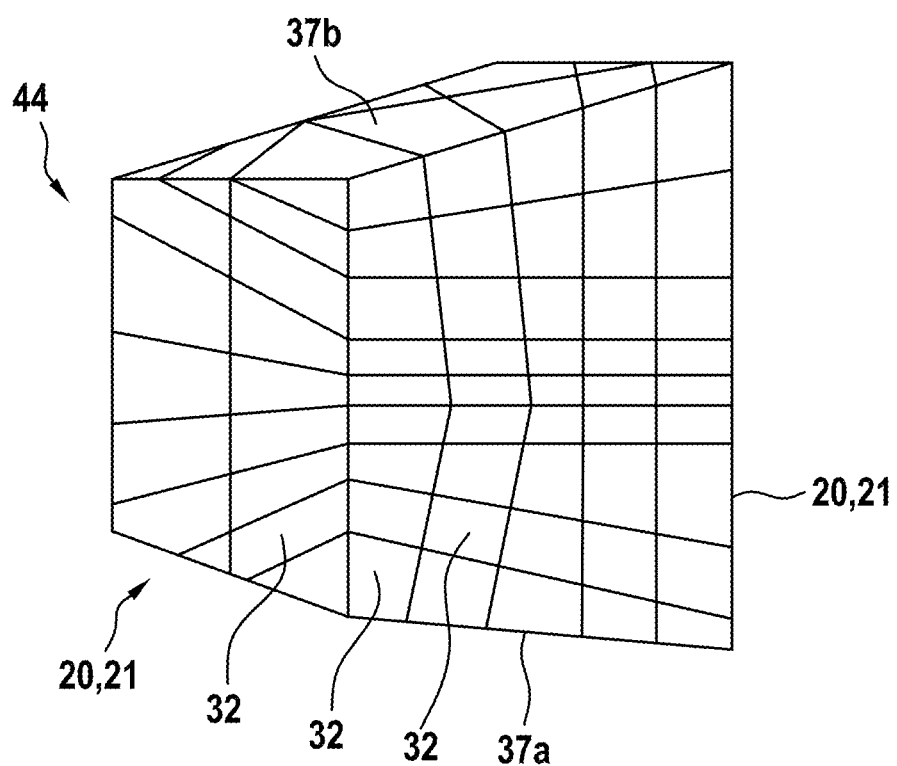
FIG. 12 shows a schematic third grid with variant width of elementary cells.

FIGS. 10 to 12 show grid structures 44, which illustrate an inner structure of an air fin element 18, 18'. Each quadrilateral represents one elementary cell 32. FIGS. 10 to 12 show that the elementary cells may be scaled along different directions of the air fin element 18, 18'.

FIG. 10 is a schematic top view on the grid structures 44 and the air fin element 18, 18'. The air flow 30 is along the direction as indicated by the arrow. The width $x_1$ at the front is bigger than the width $x_2$ at the rear whereas the depth y remains unchanged front to rear. So, by variation of the width x, the grid structure 44 becomes convergent. The elementary cells 32 which occupy the places in the grid 44 become smaller and their number needs to be increased to fill out the space between the adjacent condenser chambers 16 and/or between two walls 20, 21. Thereby, two effects may be achieved: on the one hand, the air flow resistance may increase in the y-direction, so the pressure loss of the air flow 30 is increased. On the other hand, the surface area may be increased at the rear end so that an amount of thermal energy which has not been dissipated on the first part of the air flow 30 yet can be transferred more easily from the air fins 19 of the air fin element 18, 18' to the air flow.

FIG. 11 is a schematic top view or a side view on a grid structure 44 and the air fin element 18, 18'. The air flow 30 is along the direction as indicated by the arrow. The width x is constant, wherein the depth y may be variant from front to rear (see $y_1$ and $y_3$) and/or variant from one wall 20, 21 to another wall 20, 21 (see $y_1$ and $y_2$).

FIG. 12 is a further schematic view of a grid structure 44 and the air fin element 18, 18'. This grid structure has a variant cell size of the elementary cells 32 in all three dimensions.

The two main effects of cell size variation of the elementary cells 32 may be adapting air flow resistance respective air flow pressure drop by converging or diverging the size of the pores/and or channels in the 3D minimal surface and improving the heat transfer by varying the size of the surface area.

Figure 13:
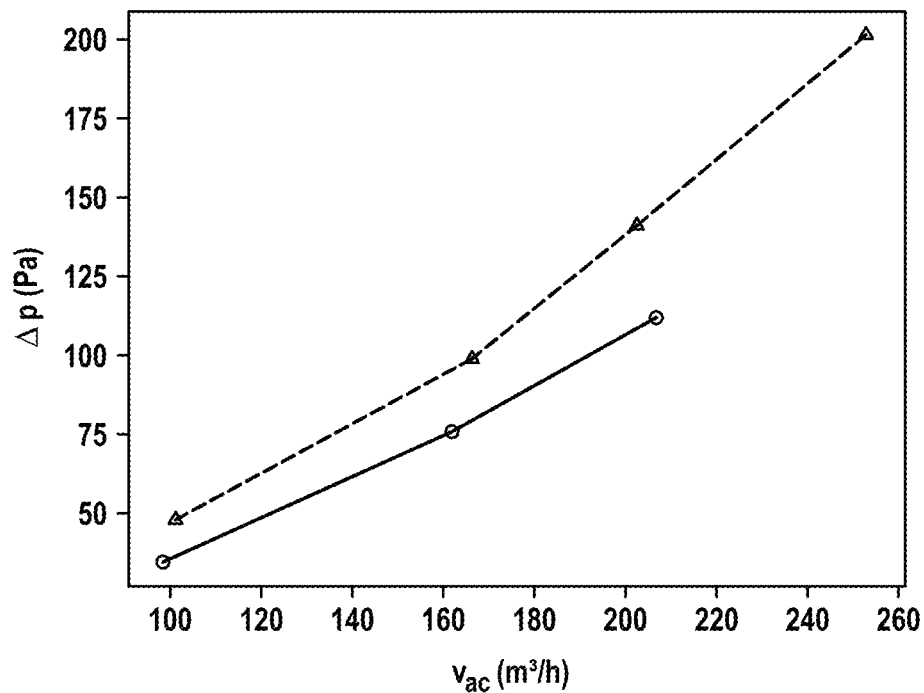
FIG. 13 shows a diagram of an air pressure drop as a function of the air flow volumetric rate.
Figure 14:
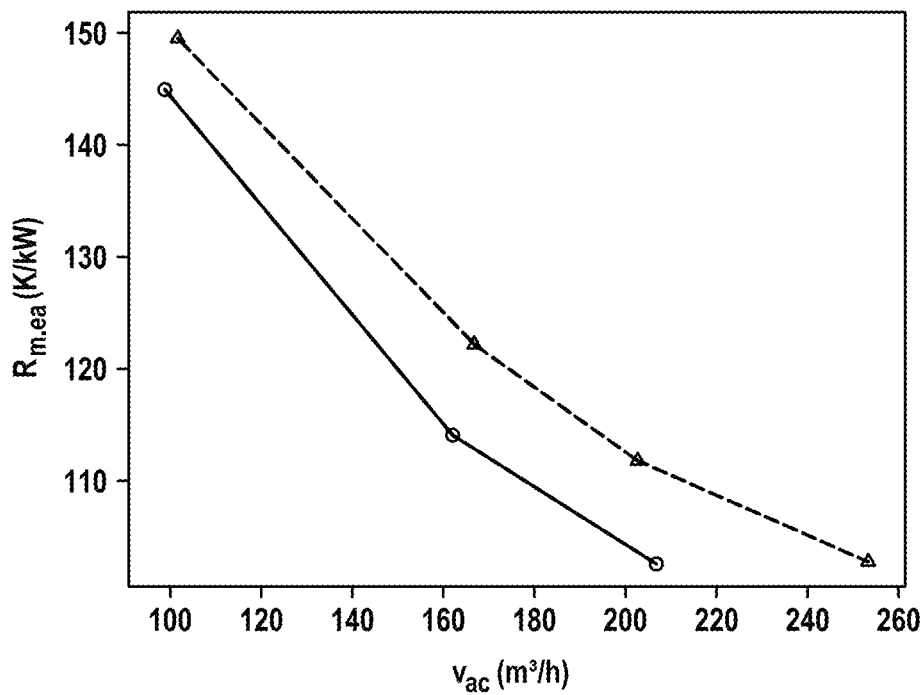
FIG. 14 shows a diagram of a thermal resistance as a function of the air flow volumetric rate.

FIGS. 13 and 14 are diagrams representing results of a test procedure, which was performed to compare properties of a heat dissipation device as described herein to a conventional, wavy fin design. For the test, two 3D prototypes of a heat dissipation device were manufactured in aluminium with additive manufacturing. Acetone was used as working fluid. One sample had conventional wavy type of fins and the other one had Schwarz D fins, both having a minimum fin gap of 2.8 mm. All other dimensions of the two 3D prototypes were equal.

In FIG. 13, the air pressure drop as a function of the air flow volumetric rate is displayed. The lower line represents the air pressure drop in an air fin element of the disclosure; the upper line is related to a conventional fin design.

In FIG. 14, the air thermal resistance as a function of the air flow volumetric flow rate is displayed. The lower line represents the values obtained with an air flow element of the disclosure. Again, the upper line represents the value of conventional design.

The experimental results showed the following improvements achieved by the use of air fin elements provided with Schwarz D fins. The air pressure drop was reduced by 27% compared to wavy fins. The thermal performance was also improved by using Schwarz D fins. The hotspot temperature was reduced by 4 K at 740 W. The evaporator to air thermal resistance was decreased by 10%. This may be further reduced if comparison is done at same pumping power.

The improved performance of the air fin elements in the heat dissipation device of the disclosure is a result of an increased air heat transfer coefficient and area. Conventional wavy fins had 2.800 cm2 for the air heat transfer area. In an air fin element of the disclosure having Schwarz D surfaces, the heat transfer area was increased by 18% to 3.300 cm2.

A burst test was also performed with water to check the mechanical stiffness. Conventional wavy fin arrangements showed first deformations at 7 bars and burst pressure of 9.2 bars. Schwarz fins in an air fin element of the disclosure showed first deformations at 10 bar and burst pressure of 14 bars which is an improvement by up to 50%.

While the disclosure has been illustrated and described in detail in the drawings and foregoing description, such illustration and description are to be considered illustrative or exemplary and not restrictive; the disclosure is not limited to the disclosed embodiments. Other variations to the disclosed embodiments can be understood and effected by those skilled in the art and practising the claimed disclosure, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 heat dissipating device
12 heat source
14 evaporator chamber
16 condenser chamber
18 air fin element
18' air fin element
19 air fin
20 side wall
21 condenser chamber wall
22 terminal plate
24 working fluid
26 evaporator cavity
28 condenser cavity
30 air flow
32 elementary cell
34 linear web
34a linear web
34b linear web
36 reinforced rib
37a air inlet side
37b air outlet side
38 nodal point
40 thin rod
42 void
44 grid structure

The invention claimed is:

1. A heat dissipation device comprising:
an evaporator chamber at least partially filled with a working fluid to be evaporated when being heated by a heat source;
at least one condenser chamber for receiving evaporated working fluid and for condensing the evaporated working fluid, wherein the condenser chamber is interconnected with the evaporator chamber in a fluid conductive manner; and
at least one air fin element interconnected between the condenser chamber and one of a further condenser chamber and a side wall of the heat dissipation device, wherein the air fin element has a triply periodic surface providing air fins, wherein the triply periodic surface has a scaling gradient along at least one given axis along which a size of elementary cell, of which the triply periodic surface is composed varies, and wherein the scaling of elementary cells is reduced along an air flow direction, and wherein a scaling of elementary cells is reduced along a direction between the condenser chamber and one of a further condenser chamber and a side wall of the heat dissipation device.

2. The heat dissipation device of claim 1, wherein the triply periodic surface is a minimal surface.

3. The heat dissipation device of claim 1, wherein the triply periodic minimal surface is a Schwarz primitive triply periodic minimal surface, a Schwarz diamond triply periodic minimal surface and/or a gyroid triply periodic minimal surface.

4. The heat dissipation device of claim 1,
wherein a maximum scaling is provided at an air inlet side and a minimum scaling at an air outlet side.

5. The heat dissipation device of claim 1, wherein the triply periodic surface of the air fin element and at least one of a condenser chamber wall of the condenser chamber and the side wall of the heat dissipation device are aligned with each other.

6. The heat dissipation device of claim 5, wherein the triply periodic surface of the air fin element and at least one of the condenser chamber wall and the side wall are aligned such that their intersection area is maximized.

7. The heat dissipation device of claim 1, wherein the air fin element has at least one reinforced rib being a part of the air fin element having a greater wall thickness than another part of the air fin element.

8. The heat dissipation device of claim 7, wherein the reinforced rib extends between the condenser chamber and one of the further condenser chambers and the side wall of the heat dissipation device.

9. The heat dissipation device of claim 7, wherein at least one reinforced rib is provided at an air inlet side and/or at an air outlet side and/or at a top of the air fin element.

10. The heat dissipation device of claim 7, wherein at least one reinforced rib is provided at a location within the air fin element having a local maximum of von Mises stress simulated with given vapor pressure inside the condenser chamber.

11. The heat dissipation device of claim 1, wherein the condenser chamber and the further condenser chamber are aligned orthogonally to the evaporator chamber.

12. The heat dissipation device of claim 1, wherein the heat dissipation device is made by additive manufacturing.

13. A heat dissipation device comprising:
an evaporator chamber at least partially filled with a working fluid to be evaporated when being heated by a heat source;
at least one condenser chamber for receiving evaporated working fluid and for condensing the evaporated working fluid, wherein the condenser chamber is interconnected with the evaporator chamber in a fluid conductive manner; and
at least one air fin element interconnected between the condenser chamber and one of a further condenser chamber and a side wall of the heat dissipation device,
wherein the air fin element has a triply periodic surface providing air fins, wherein the triply periodic surface has a scaling gradient along at least one given axis along which a size of elementary cell, of which the triply periodic surface is composed varies, and wherein the scaling of elementary cells is reduced along an air flow direction,
wherein the air fin element has at least one reinforced rib being a part of the air fin element having a greater wall thickness than another part of the air fin element, and
wherein at least one reinforced rib is provided at a location within the air fin element having a local maximum of von Mises stress simulated with given vapor pressure inside the condenser chamber.

* * * * *